(12) United States Patent
Jeong et al.

(10) Patent No.: US 7,880,661 B2
(45) Date of Patent: Feb. 1, 2011

(54) ANALOG-DIGITAL CONVERTER AND ON-DIE THERMAL SENSOR INCLUDING THE SAME

(75) Inventors: Chun-Seok Jeong, Kyoungki-do (KR); Jae-Jin Lee, Kyoungki-do (KR); Joong-Sik Kih, Kyoungki-do (KR); Jong-Man Im, Kyoungki-do (KR); Jae-Woong Choi, Kyoungki-do (KR); Myoung-Jun Chai, Kyoungki-do (KR); Kae-Dal Kwack, Kyoungki-do (KR)

(73) Assignees: Hynix Semiconductor Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 11/819,816

(22) Filed: Jun. 29, 2007

(65) Prior Publication Data

US 2008/0180300 A1   Jul. 31, 2008

(30) Foreign Application Priority Data

Jan. 31, 2007  (KR) ............... 10-2007-0009864

(51) Int. Cl.
*H03M 1/50* (2006.01)
(52) U.S. Cl. ................................ 341/166; 341/155
(58) Field of Classification Search ............. 341/155, 341/168, 169, 158; 327/538, 539
See application file for complete search history.

(56) References Cited

U.S. PATENT DOCUMENTS 3,316,547 A * 4/1967 Ammann .............. 341/167
3,849,775 A * 11/1974 Buchanan et al. ........ 341/116
3,895,376 A * 7/1975 Uchida ................ 341/128
4,243,974 A * 1/1981 Mack .................. 341/139
4,268,820 A * 5/1981 Hareyama .............. 341/168
4,448,549 A * 5/1984 Hashimoto et al. ....... 374/170

(Continued)

FOREIGN PATENT DOCUMENTS

JP   10-255467   9/1998

(Continued)

OTHER PUBLICATIONS

Korean Office Action, with English translation, issued in Korean Patent Application No. KR 10-2007-0009864, mailed Apr. 28, 2008.

(Continued)

*Primary Examiner*—Peguy JeanPierre
(74) *Attorney, Agent, or Firm*—IP & T Group LLP (57) ABSTRACT

An on-die thermal sensor includes an integrating analog-digital converter not requiring a negative reference voltage input. The on die thermal sensor includes a band gap unit, an integrating unit and a counting unit. The band gap unit senses a temperature to output a first voltage corresponding to the sensed temperature. The integrating unit integrates a difference between a reference voltage and a comparing voltage to output a second voltage wherein the comparing voltage has a voltage level higher than that of the reference voltage. The counting unit counts clocks of a clock signal input thereto until the second voltage reaches the first voltage, thereby outputting a thermal code corresponding to the voltage level of the first voltage.

25 Claims, 5 Drawing Sheets

U.S. PATENT DOCUMENTS

| | | | | |
|---|---|---|---|---|
| 4,567,465 A * | 1/1986 | Komiya | | 341/168 |
| 4,746,901 A * | 5/1988 | Smith | | 341/156 |
| 5,101,206 A * | 3/1992 | Riedel | | 341/156 |
| 5,117,227 A * | 5/1992 | Goeke | | 341/166 |
| 5,177,696 A * | 1/1993 | Bonne | | 702/136 |
| 5,245,646 A * | 9/1993 | Jackson et al. | | 377/2 |
| 5,323,156 A * | 6/1994 | Budmiger | | 341/143 |
| 6,016,051 A * | 1/2000 | Can | | 323/315 |
| 6,243,034 B1 * | 6/2001 | Regier | | 341/166 |
| 6,531,911 B1 | 3/2003 | Hsu et al. | | |
| 6,717,393 B2 * | 4/2004 | Male | | 324/76.17 |
| 6,958,613 B2 | 10/2005 | Braun et al. | | |
| 6,980,020 B2 | 12/2005 | Best et al. | | |
| 7,151,390 B2 | 12/2006 | Nguyen et al. | | |
| 7,170,313 B2 | 1/2007 | Shin | | |
| 7,176,711 B2 | 2/2007 | Park et al. | | |
| 2004/0090826 A1 * | 5/2004 | Ogiwara et al. | | 365/189.07 |
| 2007/0126615 A1 * | 6/2007 | Kim et al. | | 341/144 |
| 2008/0054987 A1 * | 3/2008 | Choi et al. | | 327/512 |
| 2008/0095213 A1 * | 4/2008 | Lin et al. | | 374/170 |

FOREIGN PATENT DOCUMENTS

| | | |
|---|---|---|
| JP | 2003-143011 | 5/2003 |
| JP | 2004-165905 | 6/2004 |
| JP | 2005-285125 | 10/2005 |
| JP | 2006-129423 | 5/2006 |
| KR | 2002-0014516 | 2/2002 |
| KR | 10-2005-0082636 | 8/2005 |

OTHER PUBLICATIONS

Jong-Man, Im et al., "A High Accuracy CMOS Temperature Sensor in DRAM," Division of Electrical and Computer Engineering, Hanyang University, Ichon, Korea.

Jong-Man, Im et al., "High Resolution CMOS Temperature Sensor with Single Slope A/D Converter," Division of Electrical and Computer Engineering, Hanyang University, Ichon, Korea.

Korean Office Action, with partial English translation, issued in Korean Patent Application No. KR 10-2007-0009864, mailed Jan. 5, 2009.

* cited by examiner

ANALOG-DIGITAL CONVERTER AND ON-DIE THERMAL SENSOR INCLUDING THE SAME

CROSS-REFERENCE TO RELATED APPLICATIONS

The present invention claims priority of Korean patent application no. 10-2007-0009864, filed in the Korean Patent Office on Jan. 31, 2007, which is incorporated by reference in its entirety.

BACKGROUND OF THE INVENTION

The present invention relates to an analog-digital converter, more particularly, to an on-die thermal sensor including the analog-digital converter.

An analog-digital converter is an apparatus for converting an analog signal into a digital signal. For example, an analog-digital converter converts an analog voltage into a digital code corresponding to the voltage level of the analog voltage.

In order to consider an analog-digital converter, an on-die thermal sensor including the analog-digital converter is described below. The on-die thermal sensor is an apparatus for controlling a period of a refresh operation of a semiconductor memory device according to a temperature.

Figure 1:
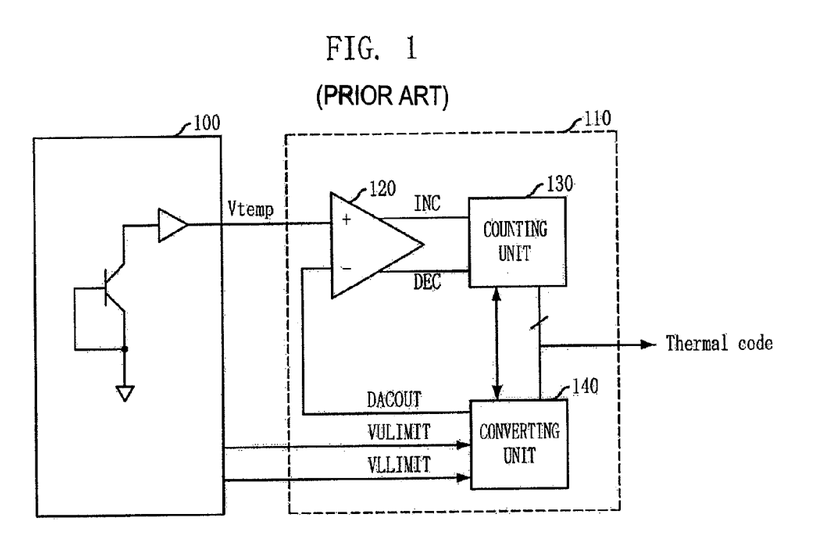
FIG. 1 is a block diagram of a conventional on-die thermal sensor that includes an analog-digital converter.

FIG. 1 is a block diagram of a conventional on-die thermal sensor. The conventional on-die thermal sensor includes a band gap unit 100 and an analog-digital converter 110.

The band gap unit 100 senses a temperature by using a characteristic of a bipolar junction transistor (BJT). A base-emitter voltage Vbe of the BJT changes in the proportion of $-1.8\,mV/°C$. per temperature changes. Accordingly, the band gap unit 100 amplifies the small change base-emitter voltage Vbe and outputs a first voltage Vtemp changing in the proportion of one to one per unit temperature change. As temperature increases, the first voltage Vtemp decreases.

The analog-digital converter 110 includes a voltage comparing unit 120, a counting unit 130, and a converting unit 140. The analog-digital converter 110 converts the first voltage Vtemp output from the band gap unit 100 into a thermal code which is a digital code.

The converting unit 140 is a digital-analog converter. The converting unit 140 outputs an analog second voltage DACOUT in response to the thermal code output from the counting unit 130. Voltages VULIMIT and VLLIMIT, input into the converting unit 140, determine maximum and minimum values of the second voltage DACOUT, respectively.

The voltage comparing unit 120 compares the first voltage Vtemp and the second voltage DACOUT. When the first voltage Vtemp is less than the second voltage DACOUT, the voltage comparing unit 120 outputs a decease signal DEC for decreasing the thermal code determined in the counting unit 130. When the first voltage Vtemp is higher than the second voltage DACOUT, the voltage comparing unit 120 outputs an increase signal INC for increasing the thermal code predetermined in the counting unit 130.

The counting unit 130 receives the increase signal INC or the decrease signal DEC from the voltage comparing unit 120. The counting unit 130 increases or decreases a thermal code determined therein and outputs a thermal code representing temperature.

That is, the analog-digital converter 110 compares the first voltage Vtemp with the second voltage DACOUT, and increases or decreases the thermal code repeatedly. Accordingly, the second voltage DACOUT tracks the first voltage Vtemp. When the tracking is finished, the thermal code becomes digital values corresponding to the first voltage Vtemp.

As described above, the analog-digital converter uses a method in which the second voltage DACOUT tracks the first voltage Vtemp. This kind of analog-digital converter is called a tracking analog-digital converter.

Figure 2:
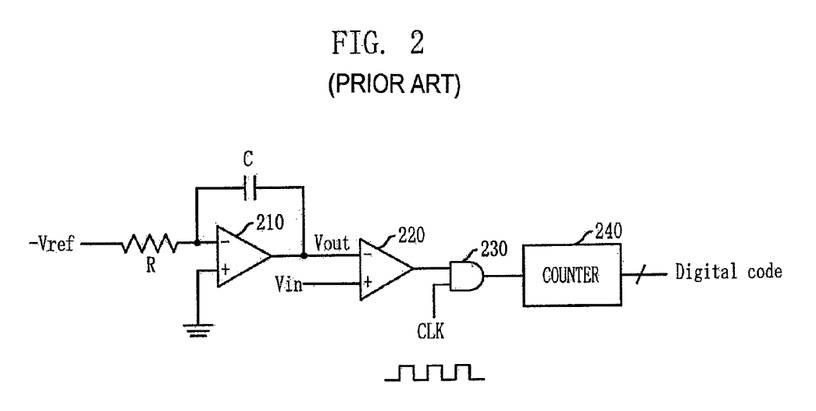
FIG. 2 is a block diagram of a conventional integrating analog-digital converter.

FIG. 2 is a block diagram of a conventional integrating analog-digital converter. The conventional integrating analog-digital converter includes an operational amplifier 210, a resistor R, a capacitor C, a comparator 220, an AND gate 230, and a counter 240.

The operational amplifier 210 integrates a negative reference voltage −Vref to output a second voltage Vout which increases as time passes. By counting clocks of a clock signal CLK input until the second voltage Vout reaches a first voltage Vin, the first voltage Vin is converted into a digital value.

The operational amplifier 210 performs the integration operation. An equation regarding a current passing through an inverting terminal of the operational amplifier 210 is described as follows.

$$\{(0-Vref)/R\}=C\{d(0-Vout)/dt\}$$

That is, the operational amplifier 210 outputs the second voltage Vout which increases as time passes as shown in the following equation.

$$Vout=(Vref/RC)*t$$

The comparator 220 compares the second voltage Vout output from the operational amplifier 210 with the first voltage Vin to be converted into a digital value. When the first voltage Vin is higher than the second voltage Vout, the comparator 220 outputs a logic high level voltage. When the second voltage Vout is higher than the first voltage Vin, the comparator 220 outputs a logic low level voltage. Accordingly, while outputting a logic high level voltage at the initial operation, the comparator 220 outputs a logic low level voltage when the second voltage Vout becomes higher than the first voltage Vin as time passes.

The AND gate 230 receives an output of the comparator 220 and the clock signal CLK. When the output of the comparator 220 has a logic high level, the clock signal CLK is output to the counter 240. When the output of the comparator 220 has a logic low level, the output of the AND gate 230 becomes a logic low level regardless of a logic state of the clock signal CLK.

The counter 240 counts the number of logic high levels of the output of the AND gate 230 to generate a digital code. That is, the counter 240 counts clocks of the clock signal CLK until the second voltage Vout becomes higher than the first voltage Vin and generates the digital code. As described above, the analog type of first voltage Vin is converted into the digital code.

The integrating analog-digital converter shown in FIG. 2 can perform the converting operation with fewer errors than a tracking analog-digital converter. However, a semiconductor memory device hardly uses the integrating analog-digital converter because it is difficult to generate the negative reference voltage −Vref.

In the conventional integrating analog-digital converter shown in FIG. 2, the reference voltage input to the inverting terminal should be negative to output the second voltage Vout being positive. However, an additional circuit for pumping the negative voltage is required to generate the negative reference voltage −Vref. The additional circuit may increase a chip size and current consumption.

SUMMARY OF THE INVENTION

Embodiments of the present invention are directed to provide an integrating analog-digital converter not requiring a negative reference voltage input and an on-die thermal sensor that includes the integrating analog digital converter.

In accordance with an aspect of the present invention, an analog-digital converter includes an integrating unit for integrating a difference between a reference voltage and a comparing voltage to output a second voltage, wherein the comparing voltage has a voltage level higher than that of the reference voltage, and a counting unit for counting clocks of a clock signal input thereto until the second voltage reaches a first voltage, thereby outputting a digital code corresponding to a voltage level of the first voltage.

In accordance with another aspect of the present invention, an on-die thermal sensor includes a band gap unit for sensing a temperature to output a first voltage corresponding to the sensed temperature, an integrating unit for integrating a difference between a reference voltage and a comparing voltage to output a second voltage wherein the comparing voltage has a voltage level higher than that of the reference voltage, and a counting unit for counting clocks of a clock signal input thereto until the second voltage reaches the first voltage, thereby outputting a thermal code corresponding to the voltage level of the first voltage.

In accordance with a further aspect of the present invention, an analog-digital converter includes an integrating unit for integrating a difference between a reference voltage and a first voltage to output a second voltage, wherein the reference voltage has zero or a positive value, and a counting unit for counting clocks of a clock signal input thereto until the second voltage reaches a predetermined voltage, thereby outputting a digital code, wherein the first voltage is an analog type of voltage.

In accordance with a further aspect of the present invention, an on-die thermal sensor includes a band gap unit for sensing a temperature to output a first voltage corresponding to the sensed temperature, an integrating unit for integrating a difference between a reference voltage and a first voltage to output a second voltage, wherein the reference voltage has zero or a positive value, and a counting unit for counting clocks of a clock signal input thereto until the second voltage reaches a predetermined voltage, thereby outputting a thermal code corresponding to a voltage level of the first voltage.

In accordance with a further aspect of the present invention, an analog-digital converter includes an integrating unit for integrating a difference between a first voltage and a comparing voltage to output a second voltage, wherein the comparing voltage has a voltage level higher than that of the first voltage, and a counting unit for counting clocks of a clock signal input thereto until the second voltage reaches a predetermined voltage, thereby outputting a digital code, wherein the first voltage is an analog voltage.

In accordance with a further aspect of the present invention, an on-die thermal sensor includes a band gap unit for sensing a temperature to output a first voltage corresponding to the temperature, an integrating unit for integrating a difference between a first voltage and a comparing voltage to output a second voltage, wherein the comparing voltage has a voltage level higher than that of the first voltage, and a counting unit for counting clocks of a clock signal input thereto until the second voltage reaches a predetermined voltage, thereby outputting a thermal code corresponding to a level of the first voltage.

DESCRIPTION OF SPECIFIC EMBODIMENTS

An integrating analog-digital converter in accordance with the present invention need not use a negative voltage. There is no need for an additional charge pump to generate a negative voltage. Moreover, no need for a negative reference voltage makes the integrating analog-digital converter widely applied to apparatuses such as an on-die thermal device Hereinafter, a semiconductor memory device in accordance with the present invention will be described in detail referring to the accompanying drawings.

Figure 3:
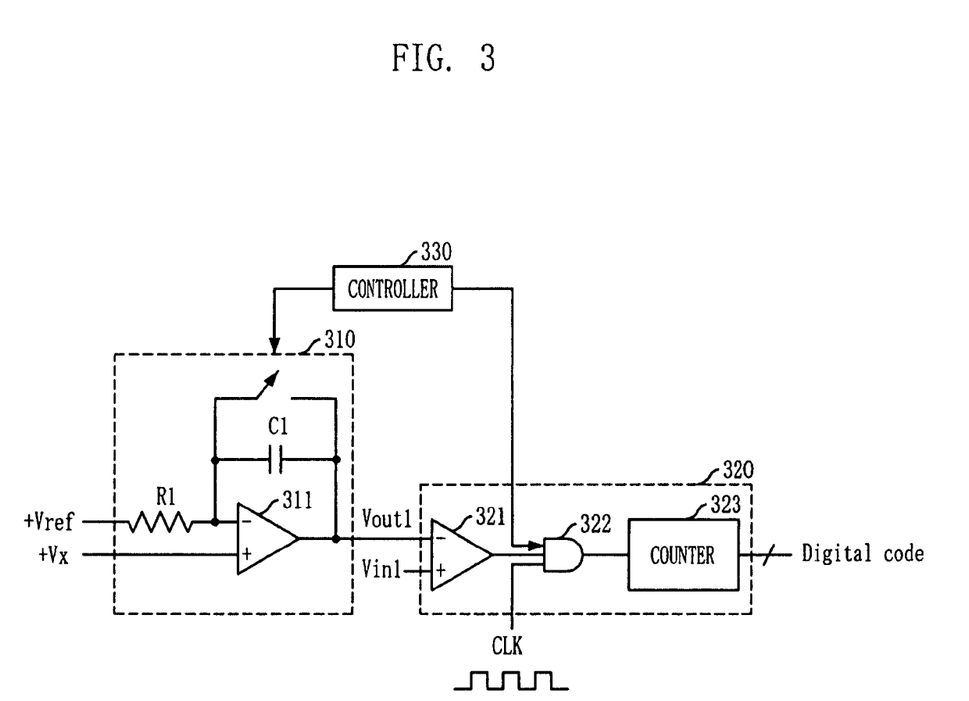
FIG. 3 is a block diagram of an integrating analog-digital converter in accordance with a first embodiment of the present invention.

FIG. 3 is a block diagram of an integrating analog-digital converter in accordance with a first embodiment of the present invention. The integrating analog-digital converter includes an integrating unit 310 and a counting unit 320.

The integrating unit 310 receives a reference voltage Vref having zero or a positive value through an inverting terminal and a comparing voltage Vx, higher than the reference voltage Vref, through a noninverting terminal. The integrating unit 310 integrates a difference between the reference voltage Vref and the comparing voltage Vx and outputs a second voltage Vout1. The counting unit 320 counts clock signal input until the second voltage Vout1 reaches a level of a first voltage Vin1 which would be converted into a digital value. And then, the counting unit 320 outputs a digital code corresponding to the level of the first voltage Vin1.

The integrating unit 310 includes an operational amplifier 311, a resistor R1 and a capacitor C1. The operational amplifier 311 receives the comparing voltage Vx through a noninverting terminal. The resistor R1 is connected to an inverting terminal of the operational amplifier 311 and receives the reference voltage Vref. The capacitor C1 is connected between the inverting terminal and an output terminal of the operational amplifier 311

The counting unit 320 includes a comparator 321, an AND gate 322 and a counter 323. The comparator 321 compares the first voltage Vin1 and the second voltage Vout1. The AND gate 322 receives a clock signal CLK and an output of the comparator 321. The counter 323 counts an output of the AND gate 322 and outputs the digital code.

An equation regarding a current passing through the inverting terminal of the operational amplifier 311 is described by the following equation.

$$\{(Vx-Vref)/R\}=C\{d(Vx-Vout1)/dt\}$$

The above equation is solved as expressed in the following equation, regarding the second voltage Vout1.

$$Vout=\{Vx-Vref)/RC\}*t+Vx \text{ (Vx>Vref)}$$

Herein, the values Vx, Vref, R and C are constants. The second voltage Vout1 increases over time the same as the conventional second voltage Vout does.

The comparator 321 compares the second voltage Vout1 output from the operational amplifier 311 with the first voltage Vin1 to be converted into a digital value. When the first voltage Vin1 is higher than the second voltage Vout1, the comparator 321 outputs a high logic level of voltage. When the second voltage Vout1 is higher than the first voltage Vin1, the comparator 321 outputs a low logic level of voltage. Accordingly, while outputting a high logic level of voltage at the initial operation, the comparator 321 outputs a low logic level voltage when the second voltage Vout1 becomes higher than the first voltage Vin1 over time.

The AND gate 322 receives an output of the comparator 321 and the clock signal CLK. When the output of the comparator 321 is a high logic level, the clock signal CLK is inputted to the counter 323. When the output of the comparator 321 is a low logic level, an output of the AND gate 322 becomes a low logic level regardless of the clock signal CLK.

The counter 323 counts high logic levels of the output of the AND gate 322 and generates a digital value. That is, the counter 323 counts clock signal input until the second voltage Vout1 becomes higher than the first voltage Vin1 and generates the digital code. As described above, the analog first voltage Vin1 is converted into the digital value.

The integrating analog-digital converter in accordance with the present invention receives the comparing voltage Vx through the noninverting terminal of the operational amplifier 311. The comparing voltage Vx is higher than the reference voltage Vref. Accordingly, the reference voltage Vref has a positive value and there is no need for pumping a negative voltage.

As described in FIG. 3, the analog-digital converter may further include a controller 330. The controller 330 controls enablement of the integrating unit 310 by shorting or breaking both terminals of the capacitor C1. The controller 330 controls enablement of the counting unit 320 by inputting a low level or a high level signal to the AND gate 322.

Figure 4:
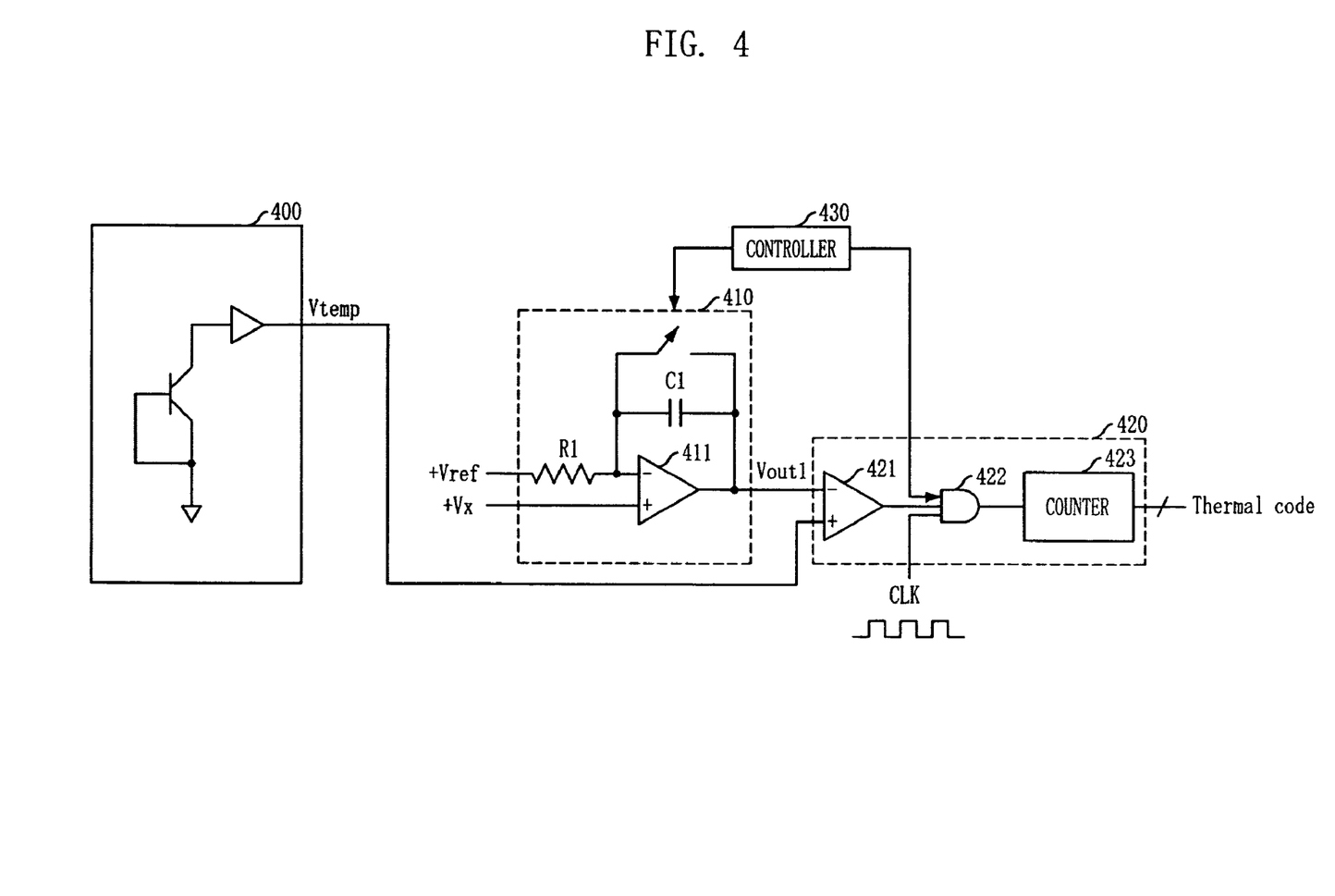
FIG. 4 is a block diagram of an on-die thermal sensor that includes an analog-digital converter in accordance with a first embodiment of the present invention.

FIG. 4 illustrates a block diagram of an on-die thermal sensor that includes the analog-digital converter in accordance with the present invention. The on-die thermal sensor includes a band gap unit 400, an integrating unit 410 and a counting unit 420.

The band gap unit 400 senses a temperature and outputs a first voltage Vtemp corresponding to the temperature. The integrating unit 410 receives a reference voltage Vref having zero or a positive value through an inverting terminal and a comparing voltage Vx higher than the reference voltage Vref through a noninverting terminal. The integrating unit 410 integrates a difference between the reference voltage Vref and the comparing voltage Vx and outputs a second voltage Vout1. The counting unit 420 counts clock signal input until the second voltage Vout1 reaches a level of the first voltage Vtemp. And then, the counting unit 420 outputs a thermal code corresponding to the level of the first voltage Vtemp.

The integrating unit 410 includes an operational amplifier 411, a resistor R1 and a capacitor C1. The operational amplifier 411 receives the comparing voltage Vx through a noninverting terminal. The resistor R1 is connected to an inverting terminal of the operational amplifier 411 and receives the reference voltage Vref. The capacitor C1 is connected between the inverting terminal and an output terminal of the operational amplifier 411.

The counting unit 420 includes a comparator 421, an AND gate 422 and a counter 423. The comparator 421 compares the first voltage Vtemp and the second voltage Vout1. The AND gate 422 receives a clock signal CLK and an output of the comparator 421. The counter 423 counts an output of the AND gate 422 and outputs the thermal code.

The on die thermal sensor may further include a controller 430 for controlling enablement of the integrating unit 410 and the counting unit 420.

The band gap unit 400 outputs the first voltage Vtemp representing a temperature by using a base-emitter voltage Vbe of a BJT the same as the conventional band gap unit does. Moreover the voltages Vref and Vx having a constant value in spite of a temperature change can be generated by the band gap unit 400 because the band gap unit 400 generally generates a variety of voltages according to a temperature change.

The analog-digital converters of the on-die thermal sensor described in FIG. 4 is identical to that in FIG. 3, including the integrating unit 410 and counting unit 420. The first voltage Vtemp output from the band gap unit 400 is an input into a noninverting terminal of the comparator 421 to be converted into a digital value. The thermal code output from the on die thermal sensor is a digital code corresponding to a level of the first voltage Vtemp.

Figure 5:
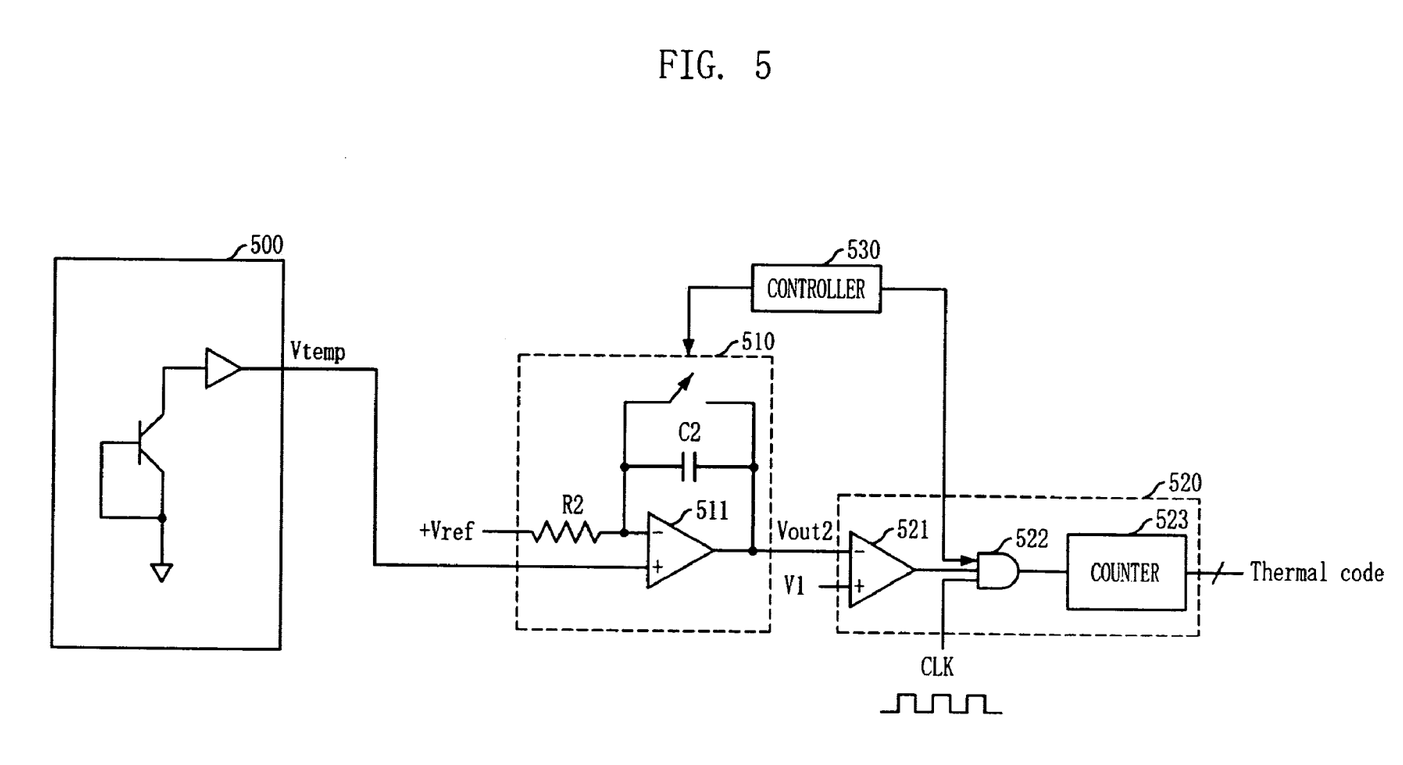
FIG. 5 is a block diagram of an analog-digital converter and an on-die thermal sensor that includes the converter in accordance with second embodiment of the present invention.

FIG. 5 illustrates a block diagram of an analog-digital converter and an on-die thermal sensor that includes the converter in accordance with a second embodiment of the present invention. A terminal to which a first voltage Vtemp is inputted is different in the first and second embodiments. However, no negative voltage is required in both embodiments.

The analog-digital converter in accordance with the second embodiment includes an integrating unit 510 and a counting unit 520. The integrating unit 510 receives a reference voltage Vref having zero or a positive value through an inverting terminal and a first voltage Vtemp higher than the reference voltage Vref through a noninverting terminal. The first voltage Vtemp is an analog voltage to be converted into a digital value. The integrating unit 510 integrates a difference between the reference voltage Vref and the first voltage Vtemp and outputs a second voltage Vout2. The counting unit 520 counts clock signal input until the second voltage Vout2 reaches a level of a predetermined voltage V1. And then, the counting unit 520 outputs a thermal code corresponding to the level of the first voltage Vtemp.

The integrating unit 510 includes an operational amplifier 511, a resistor R2 and a capacitor C2. The operational amplifier 511 receives the first voltage Vtemp through a noninverting terminal. The resistor R2 is connected to an inverting terminal of the operational amplifier 511 and receives the reference voltage Vref. The capacitor C2 is connected between the inverting terminal and an output terminal of the operational amplifier 511.

The counting unit 520 includes a comparator 521, an AND gate 522 and a counter 523. The comparator 521 compares the predetermined voltage V1 with the second voltage Vout2. The AND gate 522 receives a clock signal CLK and an output of the comparator 521. The counter 523 counts an output of the AND gate 522 and outputs the thermal code.

An equation regarding the second voltage Vout2 is:

$$Vout2=\{Vtemp-Vref)/RC\}*t+Vtemp$$

The only voltage Vx is substituted for the voltage Vtemp in the equation regarding the second voltage Vout1 in accordance with the first embodiment. The second voltage Vout2 increases over time and an increment depends on a level of first voltage Vtemp. The higher the first voltage Vtemp is, the faster the second voltage Vout2 increases.

Clock signal input is counted until the second voltage Vout2 reaches a level of the predetermined voltage V1. The time taken for the second voltage Vout2 to reach a level of the predetermined voltage V1 depends on the first voltage Vtemp. The thermal code becomes different according to the level of the first voltage Vtemp. That is, an analog type of the first voltage Vtemp can be converted into a digital thermal code corresponding to its level.

The predetermined voltage V1 should be set to be higher than the first voltage Vtemp, because the counting is performed until the second voltage Vout2, i.e., {Vtemp−Vref}/RC}*t+Vtemp, reaches the level of the predetermined voltage V1. The first voltage Vtemp should be higher than the reference voltage Vref in the second embodiment the same as the comparing voltage Vx should be in the first embodiment.

The on die thermal sensor in accordance with the second embodiment is provided by adding a band gap unit 500 to the above analog-digital converter. An output voltage of the band gap unit 500, corresponding to a temperature, becomes the first voltage Vtemp. Because the first voltage Vtemp should be higher than the reference voltage Vref, the band gap unit 500 can use a level shifter circuit to control a level of the first voltage Vtemp.

Figure 6:
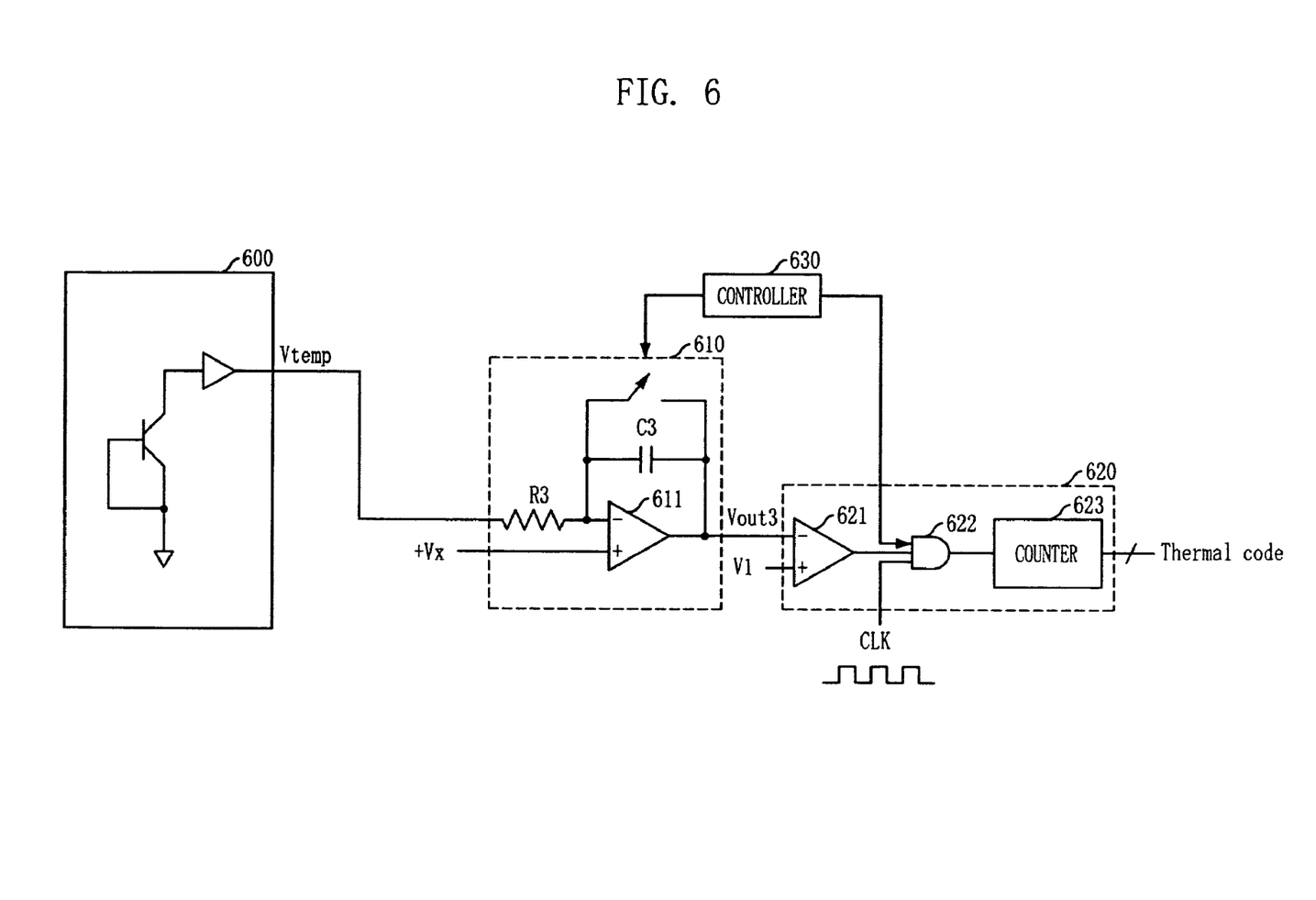
FIG. 6 is a block diagram of an analog-digital converter and an on-die thermal sensor that includes the converter in accordance with third embodiment of the present invention.

FIG. 6 illustrates a block diagram of an analog-digital converter and an on die thermal sensor that includes the converter in accordance with third embodiment of the present invention. A terminal to which a first voltage Vtemp is inputted in the third embodiment is different from those in the first and second embodiments. However, no negative voltage is required like the first and the second embodiments.

The analog-digital converter in accordance with the third embodiment includes an integrating unit 610 and a counting unit 620. The integrating unit 610 receives the first voltage Vtemp through an inverting terminal and a comparing voltage Vx higher than the first voltage Vtemp through a noninverting terminal. The first voltage Vtemp is an analog voltage to be converted into a digital value. The integrating unit 610 integrates a difference between the first voltage Vtemp and the comparing voltage Vx and outputs a second voltage Vout3. The counting unit 620 counts clock signal input until the second voltage Vout3 reaches a level of a predetermined voltage V1. And then, the counting unit 620 outputs a thermal code corresponding to the level of the first voltage Vtemp.

The integrating unit 610 includes an operational amplifier 611, a resistor R3 and a capacitor C3. The operational amplifier 611 receives the comparing voltage Vx through a noninverting terminal. The resistor R3 is connected to an inverting terminal of the operational amplifier 611 and receives the first voltage Vtemp. The capacitor C3 is connected between the inverting terminal and an output terminal of the operational amplifier 611.

The counting unit 620 includes a comparator 621, an AND gate 622 and a counter 623. The comparator 621 compares the predetermined voltage V1 and the second voltage Vout3. The AND gate 622 receives a clock signal CLK and an output of the comparator 621. The counter 623 counts an output of the AND gate 622 and outputs the thermal code.

An equation regarding the second voltage Vout3 is:

$$Vout3 = \{(Vx - Vtemp)/RC\}*t + Vx$$

The only voltage Vref is substituted for the voltage Vtemp in the equation regarding the second voltage Vout1 in accordance with the first embodiment. The second voltage Vout3 increases over time and an increment depends on a level of first voltage Vtemp. The lower the first voltage Vtemp is, the faster the second voltage Vout3 increases.

Clock signal input is counted until the second voltage Vout3 reaches a level of the predetermined voltage V1. A time taken for the second voltage Vout3 to reach a level of the predetermined voltage V1 depends on the first voltage Vtemp. The thermal code becomes different according to the level of the first voltage Vtemp. That is, an analog first voltage Vtemp can be converted into a digital thermal code corresponding to its level.

The predetermined voltage V1 should be set to be higher than the comparing voltage Vx, because the counting is performed until the second voltage Vout3, i.e., {(Vx−Vtemp)/RC}*t+Vx, reaches the level of the predetermined voltage V1. The comparing voltage Vx should be higher than the first voltage Vtemp in the third embodiment as the comparing voltage Vx should be higher than the reference voltage Vref in the first embodiment.

The on-die thermal sensor in accordance with the third embodiment is provided by adding a band gap unit 600 to the above analog-digital converter. An output voltage of the band gap unit 600, corresponding to a temperature, becomes the first voltage Vtemp. Because the first voltage Vtemp should be lower than the comparing voltage Vx, the band gap unit 600 can use a level shifter circuit to control a level of the first voltage Vtemp.

Because a conventional integrating analog-digital converter needs a negative voltage as a reference voltage, a conventional on-die thermal sensor used in a semiconductor memory device uses a tracking analog-digital converter. However, as descried in FIGS. 4 to 6, the on die thermal sensor in accordance with the present invention can use the integrating analog-digital converter without the need for a negative reference voltage. Therefore, the on die thermal sensor can be widely used in a semiconductor memory device While the present invention has been described with respect to the particular embodiments, it will be apparent to those skilled in the art that various changes and modifications may be made without departing from the spirit and scope of the invention as defined in the following claims.

What is claimed is:

1. An analog-digital converter, comprising:
   an integrating unit for integrating a difference between a reference voltage and a comparing voltage to output a second voltage, wherein the reference voltage has a zero or positive voltage level and the comparing voltage has a voltage level higher than that of the reference voltage; and
   a counting unit for counting clocks of a clock signal input thereto until the second voltage reaches a first voltage and outputting a digital code corresponding to a voltage level of the first voltage,
   wherein the integrating unit includes:
     an operational amplifier having an inverting terminal and a noninverting terminal for receiving the comparing voltage;
     a resistor having one end coupled to the inverting terminal of the operational amplifier and the other end coupled to receive the reference voltage; and
     a capacitor coupled between the inverting terminal and an output terminal of the operational amplifier, wherein the counting unit includes:
    a comparator for comparing the first voltage with the second voltage;
    a logic gate for logically combining the clock signal and an output of the comparator; and
    a counter for counting outputs of the logic gate to output the digital code,
wherein the first voltage is a voltage that varies based on a sensed temperature and the second voltage output from the integrating unit increases as time passes.

2. The analog-digital converter of claim 1, further comprising a controller for controlling the activation of the integrating unit and the counting unit.

3. An on-die thermal sensor, comprising:
    a band gap unit for sensing a temperature to output a first voltage corresponding to the sensed temperature;
    an integrating unit for integrating a difference between a reference voltage and a comparing voltage to output a second voltage, wherein the reference voltage has a zero or positive voltage level and the comparing voltage has a voltage level higher than that of the reference voltage; and
    a counting unit for counting clocks of a clock signal input thereto until the second voltage reaches the first voltage and outputting a thermal code corresponding to the voltage level of the first voltage,
    wherein the integrating unit includes:
        an operational amplifier including an inverting terminal and a noninverting terminal for receiving the comparing voltage;
        a resistor having one end coupled to the inverting terminal of the operational amplifier and the other end coupled to receive the reference voltage; and
        a capacitor coupled between the inverting terminal and an output terminal of the operational amplifier,
    where the counting unit includes:
        a comparator for comparing the first voltage with the second voltage;
        a logic gate for logically combining the clock signal and an output of the comparator; and
        a counter for counting outputs of the logic gate to output the thermal code,
    wherein the first voltage is a voltage that varies based on the temperature and the second voltage output from the integrating unit increases as time passes.

4. The on-die thermal sensor of claim 3, wherein the reference voltage is constant in spite of a temperature change.

5. The on-die thermal sensor of claim 3, further comprising a controller for controlling the activation of the integrating unit and the counting unit.

6. The on-die thermal sensor of claim 3, wherein the band gap unit generates the first voltage by using a base-emitter voltage of a bipolar junction transistor, which changes according to a temperature.

7. An analog-digital converter, comprising:
    an integrating unit for integrating a difference between a reference voltage and a first voltage to output a second voltage, wherein the reference voltage has a zero or positive voltage level; and
    a counting unit for counting clocks of a clock signal input thereto until the second voltage reaches a predetermined voltage and outputting a digital code,
    wherein the integrating unit includes:
        an operational amplifier including an inverting terminal and a noninverting terminal for receiving the first voltage;
        a resistor having one end coupled to the inverting terminal of the operational amplifier and the other end coupled to receive the reference voltage; and
        a capacitor coupled between the inverting terminal and an output terminal of the operational amplifier,
    wherein the counting unit includes:
        a comparator for comparing the predetermined voltage with the second voltage;
        a logic gate for logically combining the clock signal and an output of the comparator; and
        a counter for counting outputs of the logic gate to output the digital code,
    wherein the first voltage is an analog voltage that varies based on a temperature,
    wherein the second voltage output from the integrating unit increases as time passes, its increment depends on the first voltage.

8. The analog-digital converter of claim 7, further comprising a controller for controlling the activation of the integrating unit and the counting unit.

9. An on-die thermal sensor, comprising:
    a band gap unit for sensing a temperature to output a first voltage corresponding to the sensed temperature;
    an integrating unit for integrating a difference between a reference voltage and a first voltage to output a second voltage, wherein the reference voltage has a zero or positive voltage level; and
    a counting unit for counting clocks of a clock signal input thereto until the second voltage reaches a predetermined voltage and outputting a thermal code corresponding to a voltage level of the first voltage,
    wherein the integrating unit includes:
        an operational amplifier configured with an inverting terminal and a noninverting terminal for receiving the first voltage;
        a resistor having one end coupled to the inverting terminal of the operational amplifier and the other end coupled to receive the reference voltage; and
        a capacitor coupled between the inverting terminal and an output terminal of the operational amplifier,
    where the counting unit includes:
        a comparator for comparing the predetermined voltage with the second voltage;
        a logic gate for logically combining the clock signal and an output of the comparator; and
        a counter for counting outputs of the logic gate to output the thermal code,
    wherein the first voltage is a voltage that varies based on the temperature,
    wherein the second voltage output from the integrating unit increases as time passes, its increment depends on the first voltage.

10. The on-die thermal sensor of claim 9, wherein the reference voltage is constant in spite of a temperature change.

11. The on-die thermal sensor of claim 9, further comprising a controller for controlling the activation of the integrating unit and the counting unit.

12. The on-die thermal sensor of claim 9, wherein the band gap unit generates the first voltage by using a base-emitter voltage of a bipolar junction transistor, which changes according to temperature.

13. The on-die thermal sensor of claim 9, wherein the band gap unit controls the level of the first voltage by a level shifter.

14. An analog-digital converter, comprising:
    an integrating unit for integrating a difference between a first voltage and a comparing voltage to output a second voltage, wherein the first voltage has a zero or positive voltage level and the comparing voltage has a voltage level higher than that of the first voltage; and a counting unit for counting clocks of a clock signal input thereto until the second voltage reaches a predetermined voltage and outputting a digital code, wherein the integrating unit includes:
an operational amplifier having an inverting terminal and a noninverting terminal for receiving the comparing voltage;
a resistor having one end coupled to an inverting terminal of the operational amplifier and the other end coupled to receive the first voltage; and
a capacitor coupled between the inverting terminal and an output terminal of the operational amplifier, wherein the counting unit includes:
a comparator for comparing the predetermined voltage with the second voltage;
a logic gate for logically combining the clock signal and an output of the comparator; and
a counter for counting outputs of the logic gate to output the digital code, wherein the first voltage is an analog voltage that varies based on a sensed temperature, wherein the second voltage output from the integrating unit increases as time passes, its increment depends on the first voltage.

15. The analog-digital converter of claim 14, further comprising a controller for controlling the activation of the integrating unit and the counting unit.

16. An on-die thermal sensor, comprising:
a band gap unit for sensing a temperature to output a first voltage corresponding to the temperature;
an integrating unit for integrating a difference between a first voltage and a comparing voltage to output a second voltage, wherein the first voltage has a zero or positive voltage level and the comparing voltage has a voltage level higher than that of the first voltage; and
a counting unit for counting clocks of a clock signal input thereto until the second voltage reaches a predetermined voltage and outputting a thermal code corresponding to a level of the first voltage, wherein the integrating unit includes:
an operational amplifier having an inverting terminal and a noninverting terminal for receiving the comparing voltage;
a resistor having one end coupled to an inverting terminal of the operational amplifier and the other end coupled to receive the first voltage; and
a capacitor coupled between the inverting terminal and an output terminal of the operational amplifier, where the counting unit includes:
a comparator for comparing the predetermined voltage with the second voltage;
a logic gate for logically combining the clock signal and an output of the comparator; and
a counter for counting clocks of an output of the logic gate to output the thermal code, wherein the first voltage is a voltage that varies based on the temperature, wherein the second voltage output from the integrating unit increases as time passes, its increment depends on the first voltage.

17. The on-die thermal sensor of claim 16, further comprising a controller for controlling the activation of the integrating unit and the counting unit.

18. The on-die thermal sensor of claim 16, wherein the band gap unit generates the first voltage by using a base-emitter voltage of a bipolar junction transistor, which changes according to temperature.

19. The on-die thermal sensor of claim 16, wherein the band gap unit controls the level of the first voltage by a level shifter.

20. An analog-digital converter, comprising:
an integrating unit including an operational amplifier that has inverting and noninverting terminals, wherein the integrating unit is configured to integrate a difference between a reference voltage input to the inverting terminal and a comparing voltage input to the noninverting terminal to output a second voltage, the reference voltage has a zero or positive voltage level and the comparing voltage has a voltage level higher than that of the reference voltage; and
a counting unit for counting clocks of a clock signal input thereto until the second voltage reaches a first voltage and outputting a digital code corresponding to a voltage level of the first voltage, wherein the integrating unit further includes:
a resistor having one end coupled to the inverting terminal of the operational amplifier and the other end coupled to receive the reference voltage; and
a capacitor coupled between the inverting terminal and an output terminal of the operational amplifier, wherein the counting unit includes:
a comparator for comparing the first voltage with the second voltage;
a logic gate for logically combining the clock signal and an output of the comparator; and
a counter for counting outputs of the logic gate to output the digital code, wherein the first voltage is a voltage that varies based on a sensed temperature and the second voltage output from the integrating unit increases as time passes.

21. The analog-digital converter of claim 20, further comprising a controller for controlling the activation of the integrating unit and the counting unit.

22. An analog-digital converter, comprising:
an integrating unit including an operational amplifier configured with inverting and noninverting terminals, for integrating a difference between a reference voltage input to the inverting terminal and a first voltage input to the noninverting terminal to output a second voltage, wherein the reference voltage has a zero or positive voltage level; and
a counting unit for counting clocks of a clock signal input thereto until the second voltage reaches a predetermined voltage and outputting a digital code, wherein the integrating unit includes:
a resistor having one end coupled to the inverting terminal of the operational amplifier and the other end coupled to receive the reference voltage; and
a capacitor coupled between the inverting terminal and an output terminal of the operational amplifier, wherein the counting unit includes:
a comparator for comparing the predetermined voltage with the second voltage;
a logic gate for logically combining the clock signal and an output of the comparator; and
a counter for counting clocks of an output of the logic gate to output the digital code, wherein the first voltage is an analog voltage that varies based on a temperature, wherein the second voltage output from the integrating unit increases as time passes, its increment depends on the first voltage.

23. The analog-digital converter of claim 22, further comprising a controller for controlling the activation of the integrating unit and the counting unit.

24. An analog-digital converter, comprising:

an integrating unit including an operational amplifier that has inverting and noninverting terminals, wherein the integrating unit is configured to integrate a difference between a first voltage input to the inverting terminal and a comparing voltage input to the noninverting terminal to output a second voltage, the first voltage has a zero or positive voltage level, and the comparing voltage has a voltage level higher than that of the first voltage; and a counting unit for counting clocks of a clock signal input thereto until the second voltage reaches a predetermined voltage and, outputting a digital code, wherein the integrating unit includes:
a resistor having one end coupled to an inverting terminal of the operational amplifier and the other end coupled to receive the first voltage; and
a capacitor coupled between the inverting terminal and an output terminal of the operational amplifier, wherein the counting unit includes:
a comparator for comparing the predetermined voltage with the second voltage;
a logic gate for logically combining the clock signal and an output of the comparator; and
a counter for counting outputs of the logic gate to output the digital code, wherein the first voltage is an analog voltage that varies based on a temperature, wherein the second voltage output from the integrating unit increases as time passes, its increment depends on the first voltage.

25. The analog-digital converter of claim 24, further comprising a controller for controlling the activation of the integrating unit and the counting unit.

* * * * *